US009723714B2

(12) United States Patent
Huitema

(10) Patent No.: US 9,723,714 B2
(45) Date of Patent: Aug. 1, 2017

(54) ELECTRONIC CIRCUIT DEVICE HAVING A PROTECTIVE BACKING FOR LOW-VELOCITY IMPACTS AND HIGH-VELOCITY IMPACTS

(71) Applicant: Polyera Corporation, Skokie, IL (US)

(72) Inventor: Hjalmar Edzer Ayco Huitema, Belmont, CA (US)

(73) Assignee: Flexterra, Inc., Skokie, IL (US)

( * ) Notice: Subject to any disclaimer, the term of this patent is extended or adjusted under 35 U.S.C. 154(b) by 0 days.

(21) Appl. No.: 15/299,406

(22) Filed: Oct. 20, 2016

(65) Prior Publication Data

US 2017/0135197 A1     May 11, 2017

Related U.S. Application Data

(60) Provisional application No. 62/243,937, filed on Oct. 20, 2015.

(51) Int. Cl.
*H05K 1/03* (2006.01)
*H05K 1/02* (2006.01)
*H05K 5/00* (2006.01)

(52) U.S. Cl.
CPC .......... *H05K 1/0393* (2013.01); *H05K 1/028* (2013.01); *H05K 1/0271* (2013.01); *H05K 1/0353* (2013.01); *H05K 5/0017* (2013.01); *H05K 2201/0133* (2013.01)

(58) Field of Classification Search
CPC .... H05K 1/0393; H05K 1/028; H05K 1/0281; H05K 1/0283
See application file for complete search history.

(56) References Cited

U.S. PATENT DOCUMENTS

| | | | | |
|---|---|---|---|---|
| 2010/0282497 | A1* | 11/2010 | Hashido | H05K 3/0058 174/254 |
| 2012/0132458 | A1* | 5/2012 | Sekine | H05K 1/0393 174/254 |

* cited by examiner

*Primary Examiner* — Jeremy C Norris
(74) *Attorney, Agent, or Firm* — Karen K. Chan

(57) ABSTRACT

An electronic circuit device having a circuit stack, such as an electronic display device with a display stack, includes a protective backing having multiple layers or with a graded layer that protects the electronic circuits from both low velocity impacts and high velocity impacts. The protective backing may have an elastic layer and a viscoelastic layer or have a graded layer with a graded structure that gradually transitions between an elastic region on a first side and a viscoelastic region on a second side. The elastic first layer or region protects the display stack from low velocity impacts while the viscoelastic layer or region protects the display stack from high velocity impacts. The elastic layer or region may be arranged such that it does not add substantial stiffness to the overall circuit stack when it is flexed relatively slowly under normal use.

20 Claims, 6 Drawing Sheets

ELECTRONIC CIRCUIT DEVICE HAVING A PROTECTIVE BACKING FOR LOW-VELOCITY IMPACTS AND HIGH-VELOCITY IMPACTS

CROSS-REFERENCE TO RELATED APPLICATIONS

This application claims priority to and the benefit of the filing date of U.S. Provisional Patent Application Ser. No. 62/243,937 filed on Oct. 20, 2015, the entire disclosure of which is hereby expressly incorporated by reference herein for all uses and purposes.

TECHNICAL FIELD

The present disclosure is related generally to an electronic circuit device having a circuit stack, such as an electronic display device with a display stack, that includes a protective backing that protects the electronic circuits from both low-velocity impacts and high-velocity impacts.

BACKGROUND

Flexible micro-electronics circuit packages, such as flexible electronic displays, are often thin sheet-like, band-like, or web-like structures, having a comparatively small thickness or height relative to a length and a width, and formed of one or more substrates, layers, and/or plies. For a flexible electronic display or other flexible electronics article, the ability to be flexed multiple times to a small radius and also the ability to withstand object impact is important for reliability in the field. A dynamically flexible display is a type of flexible display that is adapted to be flexed, bent, shaped, and re-flexed and re-shaped multiple times, and optionally be able to maintain a selected bent shape after being so shaped. For ease of reference, the remaining description will refer primarily to a micro-electronics package in the form of a flexible electronic display; however, the principles of this disclosure are also applicable to other types of micro-electronics packages, such as integrated circuits, solar collectors, etc.

Micro-electronics circuit packages, such as integrated circuit chips and electronic displays, whether flexible or not, are susceptible to developing undesired faults, such as cracks in the circuitry, when put under excessive strains, for example strains caused by bending and/or impacts. One of the main problems is that the circuit elements, such as the electrodes and the switching devices, are often formed of relatively brittle materials that are subject to cracking or buckling when subjected to strains introduced from bending of the substrate on which the circuit elements are disposed. This problem is not overcome simply by making a so-called flexible micro-electronic circuit, such as a flexible electronic display. Rather, the ability of micro-electronics packages to successfully withstand bending without failing often depends on the ability to avoid or withstand excessive amounts of strains within the various electronics layers of the layer stack so as to prevent or minimize any cracking, buckling, forming of gaps, or similar strain-related faults in the electrodes of the various circuits.

A typical flexible electronic display 19, as illustrated in FIG. 1, has three main components: namely, an electro-optic display panel 20, a support substrate 21 disposed on the rear side of the electro-optic display panel 20, for example to support the electro-optic display panel 20, and a front substrate 24, which may include an optional touch sensor 25 and adhesive layer 26, disposed on the front side of the electro-optic display and through which the electro-optic display panel 20 is visible. Typically, the display panel 20 is built and/or processed on the support substrate 21. The flexible electronic display 19 may optionally have a flexible protective substrate including one or more foam layers 22 and adhesive layers 23 disposed on a rear side of the support substrate 21.

FIG. 2 illustrates a detailed cross-section of an exemplary layer stack of the typical flexible electronic display 19 of FIG. 1. The electro-optic display panel 20 includes a layer of electrical circuit components (e.g., a matrix of electrodes, switches, and other circuit components), an electo-optic medium 20a, and an electrode matrix 20b secured to a rear side of the electro-optic medium 20a. Typical electro-optic mediums include liquid crystal displays (LCDs), cholesteric texture liquid crystal (CTLC) displays, Polymer-dispersed liquid crystals (PDLC) display, E-Ink® displays, electrophoretic displays, and electrowetting displays. The electro-optic medium 20a creates and displays changeable visual information, which is visible on the front side of the electro-optic display panel 20, in response to electronic command signals received through the electrode matrix 20b. A front substrate 24 covers and protects the front side of the electro-optic medium 20a. The front substrate 24 and all the layers on top, i.e., everything on top of the electro-optic medium 20a (as depicted in FIG. 2), are often simply called the "top substrate." In this example, the top substrate includes the front substrate 24 disposed against the front side of the electro-optic medium 20a, a moisture barrier 28 disposed against the front side of the front substrate 24, an optically clear adhesive layer 27 disposed between the front substrate 24 and the moisture barrier 28 to adhere the moisture barrier 28 to the front substrate 24, an adhesive layer 26 disposed against the front side of the moisture barrier 28, and a touch sensor or touch sensitive layer 25 disposed against the front side of the adhesive layer 26. The support substrate 21 (which is also called the "bottom substrate" herein) is typically made of a single layer that carries and/or supports the electrical circuit components of the micro-electronic circuits of the electro-optic display panel 20. The support substrate 21 may be flexible enough to allow a desired flexibility of the overall flexible electronic display 19 while being resilient enough to provide support and/or protection for the electrical circuit components of the electro-optic display panel 20. For ease of reference, the layers from the bottom substrate 21 to the top-most layer, in this case the touch sensor 25, are also referred to collectively as the display stack 29.

The foam layer 22 and the adhesive layer 23, which form a backing structure stack 30, may be attached to the rear side of the display stack 29 on the bottom substrate 21 to protect the display stack from impacts. As illustrated in FIG. 2, the adhesive layer 23 is typically disposed against the rear side of the support substrate 21, and the foam layer 22 is disposed against the rear side of the adhesive layer 23. The foam layer 22 is a relatively thick layer of foam having visco-elastic properties and a stiffness dependent on the speed of compression, in that the stiffness is very low when flexed or impacted slowly and the stiffness increases when the foam is indented or impacted at a high rate of speed. This feature results in the foam layer 22 not affecting the overall flexibility of the display 19 to any significant respect, but at the same time protects the display from impact by effectively spreading the forces from an impact over a larger area.

Before proceeding further, it is noted here that the terms "dynamic bending," "dynamic flexibility," "dynamically flexible," and similar terms, for example, as used herein generally refer to the ability to bend the attachable article, and more particularly the flexible electronic component, at a number of different points, if not every point, along a length of the flexible component, the ability to bend different portions of the attachable article differently (e.g., different portions can be bent at/to different angles or curvatures), the ability to bend the attachable article in a number of different directions (e.g., in a concave direction and a convex direction), and/or the ability to bend the attachable article in some other dynamic manner. Further, dynamically flexible may refer to the ability to repeatedly bend (i.e., multiple times) in different manners and directions, for example, so to as be selectively formable and re-formable to various different shapes by a user, without damaging the intended operable usability of the article, such as would be usual and customary when used as a wrist band, belt, item of clothing, and the like. In addition, as used herein, the "front" side of the display panel 20 is the side that produces changeable optical images intended to be seen by a viewer, and the "rear" or "back" side of the display panel is the opposite side, which typically is not designed to display any particular images to be seen by the user.

Following is a short discussion about basic mechanical properties of a typical flexible electronic display. Because flexible electronic displays are typically produced on a flat surface, a curvature creates a certain strain profile in the display. Also, there can already be certain strains and stresses in the electronic display without bending due to the processing conditions of the display, such as temperature induced stress. If the electronic display is flexed too much, such that the curvature is too high, the strains developed in the electronic display can cause certain brittle layers in the display stack 29 to buckle or crack, which of course may cause the electronic display to malfunction. Typically the brittle, inorganic layers in a display, such as SiNx and/or ITO, can withstand roughly a 1% strain without buckling or cracking, depending on the amount of built-in stress and other process conditions, such as layer thickness, associated with the display. Organic layers, such as planarization layers and plastics, can typically withstand strains up to 8% without breaking or deforming in a non-elastic way.

As is well known from basic material mechanics, when a beam of any type—and for purposes of this discussion, the electronic display—is flexed, the outer radius of the flexed region is under tension, while the inner radius of the flexed region is under compression. Somewhere between the outer radius and the inner radius of the layer stack is the neutral plane (or neutral axis in a 2-D representation), where there is no tension or compression upon bending. Therefore, in a typical electronic display, such as the display stack 29, the brittle layers of the display stack that are furthest away from the neutral axis will buckle or crack first, i.e., before the layers that are close to the neutral axis, when the electronic display is bent beyond its limits, i.e., with a radius of curvature that is too short.

The position of the neutral axis in the electronic display may be approximated with the following formula:

$$Yn=(\Sigma(Ti*Ei*Yi))/(\Sigma(Ti*Ei)),\quad\text{Eq. (1)}$$

where Yn is a distance normally extending from a reference plane to the neutral line, Ti is the thickness of a respective layer of the flexible display assembly, Ei is an elastic modulus of a material placed in the respective layer of the flexible display assembly, Yi is a distance normally extending from the reference plane to the geometric center of the respective layer. Although this equation provides a simple first order approximation that does not take into account local patterning of the layers, creep in the layers, or compensating effects by deforming (visco) elastic layers, this equation provides a reasonable approximation for purposes of this disclosure. An example calculation of the neutral axis using equation 1, where the point Yi=0 has been defined as the back side of the bottom substrate 21 in FIG. 1, is provided in Table 1 below:

TABLE 1

| Layer | Young's modulus Ei (GPa) | Thickness Ti (μm) | Ei × Ti | Position Yi (μm) | Ei × Ti × Yi |
|---|---|---|---|---|---|
| 1. Substrate | 5 | 25 | 125 | 13 | 1563 |
| 2. Brittle layer | 100 | 0.1 | 10 | 25 | 251 |
| 3. Driving electronics | 5 | 10 | 50 | 30 | 1505 |
| 4. Electro-optical layer | 0.1 | 50 | 5 | 60 | 301 |
| 5. Brittle layer | 100 | 0.1 | 10 | 85 | 852 |
| 6. Substrate | 5 | 25 | 125 | 98 | 12213 |
| Sum | | | 325 | | 16683 |
| Yn (μm) | | | | | 51 |

When the display (or a part of the display) is bent over a radius ρ, the strain ε at a given location in the thickness of the display is equal to:

$$\epsilon=\Delta L/L=(L(A'B')-L(AB))/L(AB)=y/\rho,\quad\text{Eq. (2)}$$

where y is the distance from the neutral plane, being negative for the compressed part of the display, resulting in a negative strain for compression and a positive strain for tension.

If, for example, the brittle layers of the schematic display of FIG. 2 would break beyond a tensile or compressive strain of 1%, the following would be the relation between the minimum bending radius and the distance from the neutral axis:

$$\rho_{min}=y/1\%\quad\text{Eq. (3)}$$

Using the numbers developed in Table 1 results in a minimum bending radius of 2.6 mm for the first brittle layer and 3.4 mm for the second brittle layer.

In general, there are two primary scenarios where the strain limits of the layers of the electro-optic display panel 20 can be reached due to localized bending from the impact of an object such that undesirable cracking, buckling, and/or formation of gaps in the electrodes may occur. A first scenario occurs during impact of an object at a relatively low velocity, such as when the layers of the display are pressed slowly and steadily by a finger or pencil or other item. One common low-velocity impact situation encountered during normal daily use typically includes an elbow that bumps into the device, for example with a radius of about 10 mm, a mass of about 500 g, and an impact velocity of about 0.3 m/s. Another common low-velocity impact situation encountered during normal daily use typically includes a stylus pushing into the display, for example with a radius of about 1 mm, a mass of about 100 g, and an impact velocity of about 0.1 m/s. Yet another common low-velocity impact situation encountered during normal daily use typically includes a stylus or finger nail moving over the display while pushing, for example, with a radius of about 1 mm, a mass of about 100 g, and a lateral velocity of about 0.2 m/s. In this later example, there is typically a lateral movement that can be translated into a new display surface area being pressed by the stylus or the finger nail, where the impact velocity is similar to the lateral velocity. In general, a low velocity impact as used herein has an impact with a velocity typically lower than about 1 m/s, more typically a velocity lower than about 0.5 m/s, and that can have a velocity as low as about 0.01 m/s. Low-velocity impacts generally cause a local pressure on the electronic circuits that is applied relatively slowly and with a relatively long duration. The duration of an impact as used here is the time it takes to reach peak indentation. That is, for example, the elapsed time from when an object first touches the surface of the display panel until the time the object most deeply indents the display panel. This duration is typically short, such as less than one second. In contrast, the duration of an indentation in cases of the normal daily uses above may sometimes be longer, but that would be keeping the indentation at a certain indentation level, for example, by keeping the stylus at the same spot for a while or moving the stylus the display. The duration of an indentation can be as long as multiple seconds.

A second scenario, shown schematically in FIG. 3, occurs during a relatively high-velocity impact on the electronic display, during which the object impacting the display creates a localized spot where the individual layers of the flexible electrical display are stretched in only a small region of the overall surface area of the display. FIG. 3 illustrates a schematic cross section of the display stack when impacted at a high rate of speed by a spherical ball 31, for example. When the electro-optic medium 20a of the display, such as a liquid crystal, is either a fluid or a polymer with fluidic pockets, capsules or a polymer network in a fluid (LCD, CTLC, PDLC, E Ink, electrophoretics, electrowetting), this medium will have a Young's modulus that is orders of magnitude lower than that of either the plastic or glass present in the other layers of the display stack 29. Therefore, in general, this medium also has a much lower flexural rigidity than either plastic or glass. An impact event that typically causes a high-velocity impact is, for example, a solar cell device located outdoors that requires a resistance to extreme hail conditions, wherein the device can preferably withstand an impact equivalent to a ball with a radius of about 30 cm, a mass of about 104 g, and an impact velocity of about 15 m/s. Another impact event that typically causes a high-velocity impact is in rough environments and may be modeled as, for example, a steel ball with a radius of about 25 mm, a mass of about 510 g, and an impact velocity of about 5 m/s. Another impact event that typically causes a high-velocity impact in less rough environments may be modeled as, for example, a billiard ball having a radius of about 29.5 mm, a mass of about 139 g, and an impact velocity of about 5 m/s, or for example a steel ball having a radius of about 9.5 mm, a mass of about 28 g, and an impact velocity of about 2.5 m/s.

For a flexible electronic display or another flexible microelectronics article including a layer stack as outlined above, the preferred materials from which the circuits are made (e.g. metals like Au, Ag, Cu, ITO, Mo, Al) are often brittle, i.e., have low ductility, and therefore are subject to cracking, buckling, and breaking under strains developed, for example, when the electronics circuit undergoes bending caused by either low-velocity impacts or by high-velocity impacts as described above. Such cracks can form gaps along the circuit electrodes, for example on the order of 1 nanometer to 500 nanometers and even up to which can degrade or even prevent conduction of electrical current through the electrodes, thereby degrading or preventing proper functioning of the circuit.

Different ways to protect the electrical circuit components from developing faults due to bending and impacts have been attempted. For example, in one manner, as illustrated generally by WO 2008/133513 A1, an elastic material is adhered to the back of the display to absorb the impact energy while the display does not experience a pressure or stretching that is too high. In terms of the example shown in FIG. 2, the layer 22 of the protective backing stack 30 would be formed of an elastic material, such as rubber. Although this arrangement may be helpful for protecting the electrical circuit components against low velocity impacts, it is not as helpful for protecting against high-velocity impacts.

In another manner, as illustrated generally by EP 2551110 B1, a visco-elastic material is adhered to the back of the display in order to absorb high velocity impact. The material is selected such that it does not affect the position of the neutral plane and the minimum bending radius of the display significantly. In terms of the example shown in FIG. 2, the layer 22 of the protective backing stack 30 would be formed of a highly viscoelastic material, such as a foam. Although this arrangement may be helpful for protecting the electrical circuit components against high-velocity impacts, it is not as helpful for protecting against low-velocity impacts.

However, the problem of optimizing a protective backing material to protect the electronic circuit from both low-velocity impacts and high-velocity impacts has not yet been addressed in a satisfactory manner.

SUMMARY

According to some aspects of the disclosure, an electronic circuit device has a layer stack including a circuit stack with at least one layer of electrical circuits carried by a support substrate and a protective backing having multiple layers or with a graded layer that protects the electronic circuits from both low velocity impacts and high velocity impacts. In some arrangements, the circuit stack may form and/or include a display stack, and the electronic circuit device may form and/or include an electronic display device. In some arrangements, the protective backing may have a first layer that is an elastic layer formed of a relatively more stiff and elastic material, such as a plastic or rubber, combined with a second layer that is a viscoelastic layer with a relatively higher viscosity that can be indented, such as a viscoelastic foam. In some arrangements, the protective backing may have a single graded layer with a graded structure, wherein one side of the graded material has a region of higher elasticity (i.e., Young's modulus) and is more elastic, the other side has a region of lower elasticity and is more viscoelastic, and the elasticity and the viscoelasticity of the material vary gradually through the thickness of the layer from the one side to the other side. The elastic first layer or region of the protective backing protects the electrical circuits from low velocity impacts while the viscoelastic second layer or region of the protective backing protects the electrical circuits from high velocity impacts. Preferably, the viscoelastic second layer or region is arranged as not to add substantial stiffness to the overall circuit stack when it is flexed relatively slowly under normal use.

According to some aspects of the disclosure, the elastic layer or region of the protective backing may be disposed nearer to the circuit stack than the viscoelastic layer or region of the protective backing. For example, the elastic layer or section may be disposed adjacent the circuit stack, and the viscoelastic layer or region may be disposed on the opposite side of the elastic layer or region from the circuit stack. The location of the neutral plane of the entire layer stack is least affected when the elastic layer or region is placed closest to the circuit stack. In addition, this arrangement helps to ensure that the radius of curvature of the layer stack under a low velocity impact does not become too small, leading to defects due to a strain level that is higher than the critical strain level in the layer stack or defects caused by too much local stretching.

According to some aspects of the disclosure, a third layer that is preferably a foam layer may be placed between the elastic layer and the circuit stack. This third, foam layer is preferably thinner than either the elastic layer or the viscoelastic layer. The addition of the third layer may optimize the pressure spreading for objects impacting the electronic circuit device or at a low velocity because the foam easily deforms and thereby acts as a pressure spreader. After compression of the third layer, the elastic layer prevents the radius of curvature of the circuit stack from becoming too small. Optionally, while the third layer may have viscoelastic properties, it is not necessary for the third layer to have viscoelastic properties.

According to some aspects of the disclosure, the elastic layer or region may optionally be thinner than the viscoelastic layer or region. For example, the elastic layer or region may be 2 to 10 times thinner than the viscoelastic layer or region.

Additional aspects, arrangements, features, and/or technical effects in accordance with the present disclosure will be evident upon study of the drawings and the following descriptions.

DETAILED DESCRIPTION

Figure 1:
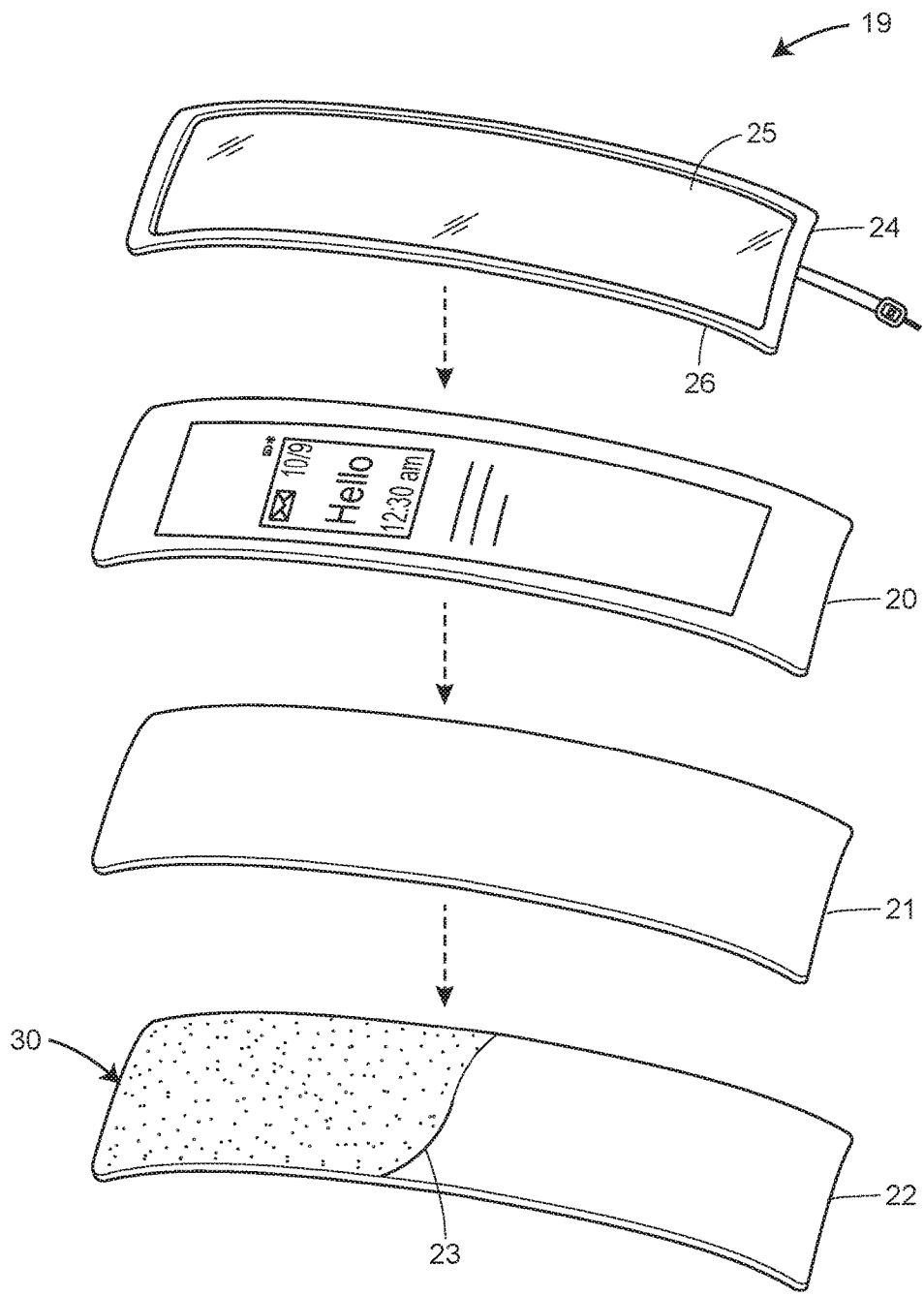
FIG. 1. illustrates typical components of a flexible electronic display.

In very general terms according to some aspects of the disclosure, an electronic circuit device having a circuit stack, such as an electronic display device with a display stack, includes a protective backing having multiple layers or having a graded layer that protects the electronic circuits from both low velocity impacts and high velocity impacts. The protective backing may have an elastic first layer and a viscoelastic second layer or may have a graded layer with a graded structure that gradually transitions between an elastic region on a first side and a viscoelastic region on a second side. The elastic layer or region protects the display stack from low velocity impacts while the viscoelastic layer or region protects the display stack from high velocity impacts. The elastic layer or region may be arranged such that it does not add substantial stiffness to the overall circuit stack when it is flexed relatively slowly under normal use.

In some arrangements, the circuit stack has at least one layer of electrical circuits carried by a support substrate and disposed on a front side of the support substrate. The protective backing may be carried by the support substrate and may be disposed on a back side of the support substrate.

In some arrangements, the protective backing includes a first layer formed of an elastic material and a second layer formed of an elastomeric material. The elastic material has a higher elasticity than the elastomeric material (under low velocity impact), and the elastomeric material has a higher viscoelasticity than the elastic material. The elastic layer protects the electrical circuits from low velocity impacts, and the viscoelastic layer protects the electrical circuits from high velocity impacts. Preferably, the viscoelastic layer does not add substantial stiffness to the overall circuit stack when flexed relatively slowly under normal use.

In some arrangements, the protective backing further includes a third, foam layer made of a flexible foam. The foam layer may be disposed between the elastic layer and the viscoelastic layer. Preferably, the foam layer is thinner than each of the elastic layer and the viscoelastic layer. The foam layer may be disposed between the elastic layer and the support substrate of the circuit stack.

In some arrangements, the protective backing is formed of a single, graded layer with a graded structure that varies gradually through the thickness of the layer from a first side to a second side, wherein the first side has a region of higher elasticity than the second side, and the second side has region of higher viscoelasticity than the first side. The elasticity and the viscoelasticity of the material may vary gradually through the thickness of the layer from the first side to the second. The elastic region of the first side protects the electrical circuits from low velocity impacts, and viscoelastic region of the second side protects the electrical circuits from high velocity impacts. Further, the viscoelastic region of the second side does not add substantial stiffness to the overall circuit stack when flexed relatively slowly under normal use. Preferably, the graded layer is formed of a foam material having cells surrounded by cell walls, wherein the openness of the cells, the size of the cells, and the size of the cell walls vary gradually through the thickness of the layer from the first side to the second side. In general, the difference between "open cell foams" and "closed cell foams" is determined by the foam structure. An open cell foam has cell walls and gas (atmosphere), where the walls form an open structure that does not trap the air inside the foam. The air can therefore move in to and out of the foam. A sponge is a typical example of an open cell foam. Open cell foams mainly get their mechanical properties from the cell walls and the speed at which the air can leave the open cell structure. The speed at which air can leave and/or enter the open cell structure can give the foam a viscous response. In contrast, a closed cell foam structure has closed air (or gas) cells where the air (or gas) is trapped inside the cells. Close cell foams mainly get their mechanical properties from the compressibility of the gas, and to some extent sometimes also on the properties of the walls, which creates primarily an elastic response of the foam. The foam may be a more rigid, closed foam on the first side and a more open, visco-elastic foam on the second side. The open foam releases air more easily, thereby making it more visco-elastic. The closed foam does not release the air, thereby making it more purely elastic. This can be adjusted by mixing certain polymers during the fabrication and make it a gradient across the thickness of the foam. Also by adjusting crosslink density of the foam dependent on the position in the foam, the degree of open/close can be adjusted. The cells may have a smaller size and/or the cell walls may be thicker on the first side, and the cells may have a larger size and/or the cell walls may be thinner on the second side. In some examples, visco-elastic foams used to absorb high-velocity impacts may have densities of about 320 kg/m3 (0.32 Mg/m3), which is at the high-end of densities for foams, or less. Typical ranges for rubbers are 0.6-1.2 Mg/m3, which is at the high end of the spectrum for elastic materials, or less. For rubber, the correlation between density and stiffness appears to depend on the type of rubber used. Foams range from 0.01-0.5 Mg/m3. Typically, the higher the density of the foam, the higher the stiffness of the foam.

Figure 4:
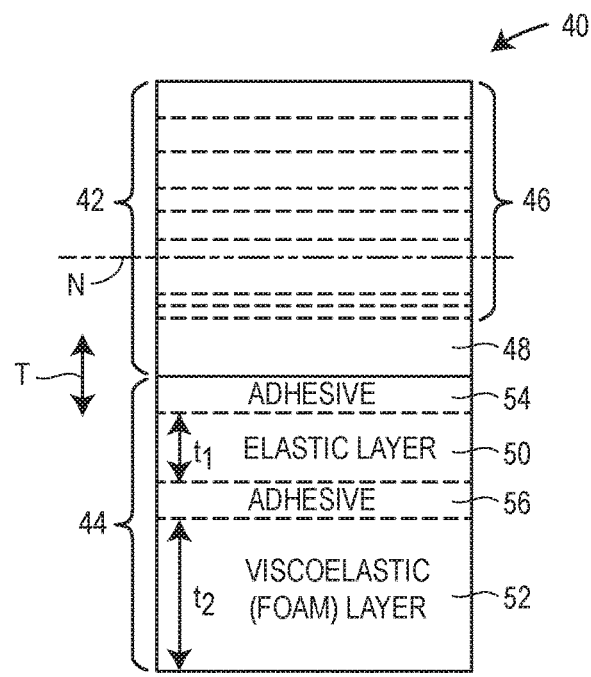
FIG. 4 is an enlarged partial cross-sectional view of a layer stack of an electronic circuit device, such as an electronic display device, exemplifying an aspect of the present disclosure.

Turning now to the specific examples of the drawings, FIG. 4 illustrates a layer stack 40 of an electronic circuit device in a first arrangement according to the present disclosure. In this arrangement, the electronic circuit device is an electronic display device, and the following description will be in terms of an electronic display device for simplicity. However, the electronic circuit device could form or be used in other types of micro-electronic devices. The electronic circuit device 40 includes a circuit stack 42 and a protective backing 44. The circuit stack 42 includes one or more layers of electrical circuits 46 carried by and disposed on a front side of a support substrate 48. Preferably, the support substrate 48 is flexible, and the circuit stack 42 is arranged to be flexible. The protective backing 44 protects the layers of electrical circuits 46 from both low velocity impacts and high velocity impacts and does not add substantial stiffness to the overall layer stack 40 when flexed out of plane relatively slowly under normal use.

Figure 2:
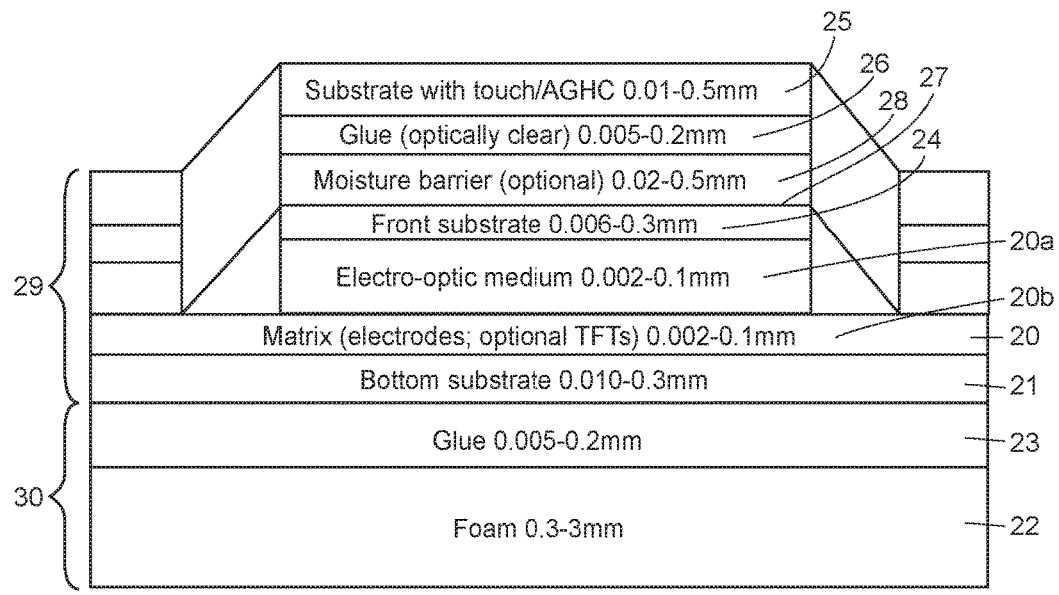
FIG. 2 is an enlarged partial cross-sectional view of a layer stack of the typical flexible electronic display of FIG. 1.
Figure 3:
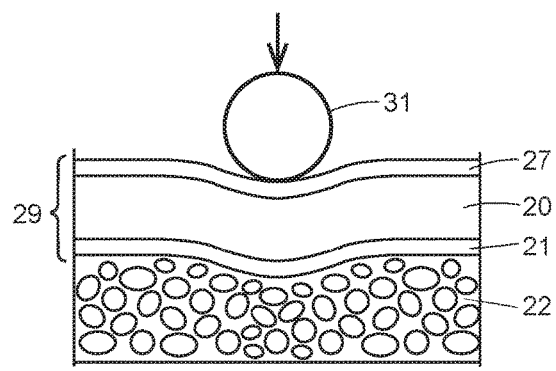
FIG. 3 is a schematic cross-sectional view of a typical flexible electronic display illustrating the effects of a high-velocity impact of a ball.

The circuit stack 42 in this arrangement may form a display stack of an electronic display device, for example, including any one or more of the layers and/or features of the display stack 29 shown in FIG. 2. The circuit stack 42 may, for example, form one or more of a liquid crystal display (LCD), a cholesteric texture liquid crystal (CTLC) display, a Polymer-dispersed liquid crystals (PDLC) display, an E-Ink® display, an electrophoretic display, and an electrowetting display. However, the circuit stack 42 may form other types of electronic display devices and/or microelectronics devices.

The protective backing 44 is carried by and disposed on a rear side of the support substrate 48 of the circuit stack 42. The protective backing 44 includes a first layer 50 and a second layer 52. The first layer 50 is formed of a first, primarily elastic material, such as an elastically flexible plastic or rubber. The second layer 52 is formed of a second, primarily elastomeric material, preferably in the form of a foam. The function of the first layer 50 is to provide an elastic response to an object pushing into the display at a relatively low velocity. The elastic response of the first layer 50 is not strain rate dependent or has a very low dependency on strain rate, and therefore provides impact protection and cushioning that is independent of the speed or velocity of an object pressing onto the top of the display 40. The function of the second layer 52 is to provide a viscoelastic response to an object pushing into the display at a relatively high speed or velocity. The viscoelastic response is strain rate dependent, i.e., has higher elastic response characteristics when strained at a relatively high velocity and relatively lower or no elastic response characteristics when strained at a relatively low velocity. Therefore, the second layer 52 not only provides additional runway (i.e., the object can penetrate into the display further when the material of the second layer compresses in order to spread the force over a larger area), but also a higher stress at higher strain rate (i.e., at a higher impact velocity). In this manner, a high velocity impact of an object can be effectively absorbed by the second layer 52, while the second layer 52 does not add substantial stiffness to the electronic display when the entire circuit stack 40 is flexed relatively slowly in normal use.

As noted above, the elastic material of the first layer 50 has a higher elasticity than the elastomeric material of the second layer 52. In addition, the elastomeric material of the second layer 52 has a higher viscoelasticity than the first elastic material of the first layer 50. Although the first layer 50 may have some viscoelastic properties, it is assumed that any viscoelastic properties of the first layer 50 are significantly less than the viscoelastic properties of the second layer 52 so as to be considered substantially negligible in comparison to the viscoelasticity of the second layer 52. Similarly, although the second layer 52 may have some elastic properties under low strain rates, it is assumed that any elastic properties of the second layer 52, in particular under low velocity impact, are significantly less than the elastic properties of the first layer 50 under low velocity impact, even to the point of being considered substantially negligible in comparison to the elastic properties of the first layer 50 under low velocity impact.

The materials and the thicknesses and the arrangement of the first layer 50 and the second layer 52 are preferably selected so that the neutral axis or plane N of the entire layer stack 40 is disposed within the plane of the most sensitive electrical circuits layer and/or layers of the display stack 42. In this manner, as well understood in the art, when the entire layer stack 40 is bent out of plane, for example when the electronic display 40 is being flexed to form a curve, minimal strains are developed within the electrical circuits, which helps prevent damaging the electrical circuits with stresses caused by any such strains. Typical specific values for thickness and viscoelastic properties of the second layer 52 (i.e., the viscoelastic layer) are, in general, dependent on the type of impact performance needed and the type of objects that are generally expected to impact the layer stack 40. Typical specific values for the thickness and elastic properties of the first layer 50 (i.e., the elastic layer) are, in general, dependent upon the flexibility requirements of the layer stack 40.

In the present arrangement, the first layer 50 is disposed closer to the support substrate 48 than the second layer 52. This arrangement is believed to have at least two technical advantages. First, the first layer 50 generally has the highest Young's modulus when there is no high velocity object impact. Therefore, the location of the neutral plane N within the entire layer stack 40 is least affected by the first layer 50 when the first layer 50 is placed closest to the rear side of the circuit stack 42. Second, the function of the first layer 50 is to ensure that the radius of curvature of the circuit stack 42 when an object is pushed into it at a low velocity does not become too small, which would lead to defects due to a strain level that is higher than the critical strain level in the circuit stack 42 or too much local stretching. This result is most effectively achieved without placing a foam layer in between the circuit stack 42 and the first layer 50 (i.e., with the first layer 50 disposed directly against the rear side of the support substrate 48) because any such foam would deform locally very easily when the speed of the object is low and therefore more likely lead to defects in the circuit stack 42.

Next, some exemplary specific values for the various physical properties and dimensions are discussed. The first layer 50 (i.e., the elastic layer) may have a Young's modulus of $10^{-3}$ GPa or higher, and more preferably may have a Young's modulus between $10^{-3}$ GPa and $2\times10^{-1}$ GPa; however, the Young's modulus of the first layer 50 need not necessarily be limited to these values. The thickness of the first layer 50 is matched with the dimensions of the specific circuit stack 42 and the flexibility requirements for the entire electronic display 40. For example, a typical thickness for a flexible electronic display is in the range of 50 μm to 750 μm. Although an electronic display is a multilayer structure, from a mechanical analysis perspective, typically the electronic display can be treated as a single component with a Young's modulus of approximately 0.1 GPa to 50 GPa, dependent on the materials used for the various layers of the display. As long as the thickness of the electronic display, multiplied by the Young's modulus of the elastic layer (e.g., the first layer 50) are in the same order of magnitude or preferably at least one order of magnitude smaller, then the position of the neutral plane N within the circuit stack 42 is not affected substantially. For a flexible electronic display having plastic substrates, the effective Young's modulus is typically in the range of 0.5 GPa to 15 GPa. The first layer 50 is preferably made of a polymer material, such as rubber and/or plastic. Another way to characterized the first layer 50, i.e., the elastic layer, is to use the typical Shore durometer hardness scale, for example, in accordance with the ASTM D2240 standard, which is incorporated herein by reference in its entirety and is generally a measure of the indentation depth of a certain steel object pressed into a material to characterize its hardness. For the first layer 50, a material having a Shore A durometer hardness value of about 35 to about 80 (typically, somewhere between a typical pencil eraser and a typical shoe heel) may be used. However, depending on the application and the display stack-up and required flexibility and use, the whole scale of materials along the Shore A spectrum (for example, from a typical rubber band to a typical ebonite rubber) could be used. Typical exemplary materials that can be used for the first layer 50 include neoprene rubber, santoprene rubber, silicone rubber, and/or ethylene-vinyl acetate (EVA). A typical thickness of the first layer 50 is in the same order of the thickness of the layer stack 42 (e.g., the display thickness for an electronic display). Typically, the first layer 50 has a thickness t1 anywhere between about 0.05 mm to about 2 mm. In one exemplary arrangement, the first layer 50 is formed of neoprene rubber with about a 50 A durometer value and a thickness t1 of about 0.1 mm coupled to a layer stack 42 having a thickness of about 0.2 mm by an adhesive layer 54 with a thickness of about 0.05 mm. However, the first layer 50 may be made of other materials with elastic properties sufficient to function in the manner described herein.

For the second layer 52, i.e., the viscoelastic (foam) layer, important parameters are its viscosity ($\eta$) and its thickness (t2). The ratio $\eta/t2$ between the viscosity and the thickness may determine the highest impact that can be absorbed. If a low viscosity foam is used, the second layer 52 may need to be thicker in order to absorb the same impact than a high viscosity foam. In contrast, a thicker, low viscosity foam may allow an object to penetrate into the circuit stack 42 further, which lowers the local pressure in the circuit stack 42 and increases the amount of stretching that takes place in the impacted area of the circuit stack. Therefore the specific properties of the foam of the second layer 52 are preferably matched to the properties, such as critical pressure and critical strain (stretching) values of the circuit stack 42 and to the expected and/or specified impacts that the circuit stack 42 needs to survive. In some arrangements, the $\eta/d$ ratio of the second layer 52 is from about 0.25 GPa s/m to about 5 GPa s/m, the viscosity $\eta$ is between about 250 Pa s to about 5 MPa s, and the thickness t2 is between about 0.5 mm to about 2 mm, as that may provide enough thickness for impact absorption, while the whole structure does not become too thick (in the T direction perpendicular to the plane of the layer stack, as illustrated in FIG. 4) for practical applications. Some exemplary materials that can be used for the second layer 52 are flexible polymer foams, Sorbothane®, and/or Poron® (both polyurethanes), gel type, memory foam, and/or vinyl foam materials. In one example, Poron® Shockseal foam with a density of 320 kg/m3 and a thickness t2 of 1.55 mm is used to support a display circuit stack 42 with a thickness of 0.2 mm. However, the viscoelasticity of the second layer 52 need not necessarily be limited to these values, and the second layer 52 may be made of other materials with viscoelastic properties sufficient to function in the manner described herein.

Moreover, the first layer 50 is preferably thinner (in the T direction perpendicular to the plane of the layer stack, as illustrated in FIG. 4) than the second layer 52. In some arrangements, the first layer 50 is between two times thinner and ten times thinner than the second layer 52. However, other thicknesses may be used depending upon the specific materials used in the circuit stack 42 and the first layer 50 and the second layer 52.

In this arrangement, the front side of the first layer 50 is coupled to the rear side of the support substrate 48 by a first layer of adhesive 54, and the front side of the second layer 52 is coupled to the rear side of the first layer 50 by a second layer of adhesive 56. However, other means of coupling the first layer 50 and the second layer 52 to the support substrate 48, such as with sonic welds, clamps, and/or fasteners, are also possible. Each of the adhesive layers 54 and 56 is typically between 5 μm to 250 μm thick. A thickness of 50 μm is ideal as such a layer is typically thick enough to cover any topology of the adjacent layers while such a layer is still relatively thin compared to the other layers in the layer stack 42.

In Table 2, below, an example calculation of the neutral plane N is shown where a rubber first layer 50 and a visco-elastic second layer 52 are added as protective backing 44. The point Yi=0 has been defined as the bottom of the support substrate 48 in FIG. 4 with a circuit stack 42 identical to the display stack 29 of FIG. 1. Thus, in distinction to the results shown in Table 1, a rubber layer (first layer 50) and a visco-elastic layer (second layer 52) are added to the calculation, as shown in FIG. 4. Compared to the display stack without a backing structure as shown in Table 1, the neutral plane of the display has only shifted by 7.5 μm by adding this backing structure.

TABLE 2

| Layer | Young's modulus Ei (GPa) | Thickness Ti (μm) | Ei × Ti | Position Yi (μm) | Ei × Ti × Yi |
|---|---|---|---|---|---|
| visco-elastic | 5.00E−05 | 500 | 0.025 | −540 | −14 |
| adhesive | 0.01 | 20 | 0.2 | −280 | −56 |
| rubber | 0.05 | 250 | 12.5 | −145 | −1813 |
| adhesive | 0.01 | 20 | 0.2 | −10 | −2 |
| 1. Substrate | 5 | 25 | 125 | 13 | 1563 |
| 2. Brittle layer | 100 | 0.1 | 10 | 25 | 251 |

TABLE 2-continued

| Layer | Young's modulus Ei (GPa) | Thickness Ti (μm) | Ei × Ti | Position Yi (μm) | Ei × Ti × Yi |
|---|---|---|---|---|---|
| 3. Driving electronics | 5 | 10 | 50 | 30 | 1505 |
| 4. Electro-optical layer | 0.1 | 50 | 5 | 60 | 301 |
| 5. Brittle layer | 100 | 0.1 | 10 | 85 | 852 |
| 6. Substrate | 5 | 25 | 125 | 98 | 12213 |
| Sum | | | 338 | | 14799 |
| Yn (μm) | | | | | 44 |

Figure 5:
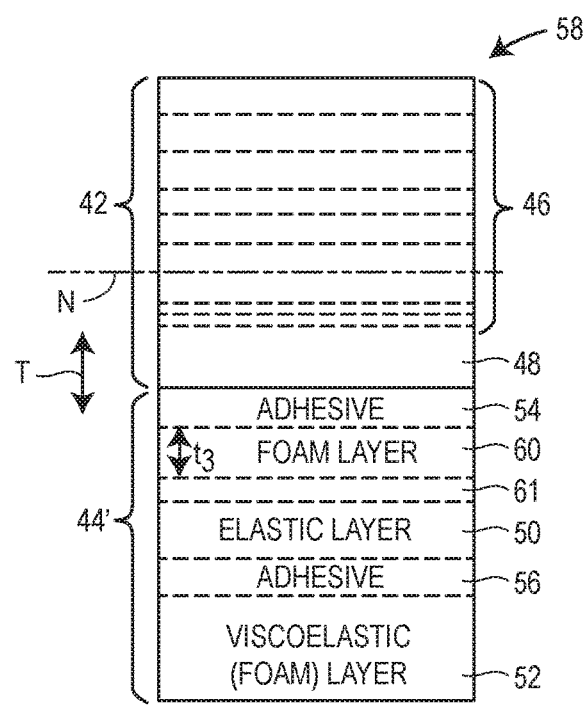
FIG. 5 is an enlarged partial cross-sectional view of a layer stack of an electronic circuit device, such as an electronic display device, exemplifying another aspect of the present disclosure.

Turning now to FIG. 5, another layer stack 58, which is generally similar to the layer stack 40 of FIG. 4, includes the circuit stack 42 and a protective backing 44', which includes the elastic first layer 50 and the viscoelastic second layer 52, as well as the adhesive layers 54 and 56. For the sake of brevity, the reader is referred to the previous descriptions of these features for additional detail. In addition, however, the protective backing 44' also includes a third layer 60, which is made of a thin layer of foam. The third layer 60 is disposed between the first layer 50 and the rear side of the support substrate 48 of the circuit stack 42. An adhesive layer 61 is disposed between the third layer 60 and the first layer 50. The adhesive layer 61 couples the third layer 60 to the first layer 50. It is believed that this thin third layer 60 of foam optimizes the pressure spreading from objects that penetrate the circuit stack 42 at low velocity because the foam will easily deform and thereby act as a pressure spreader, allowing the circuit stack 42 to stretch to a certain higher level even at low velocity impact of an object. Thus, for example, after compression of the third layer 60 of foam, the elastic first layer 50 provides strain rate independent counter pressure to absorb the slow impact. The thin layer of foam of the third layer 60 does not necessarily need to have viscoelastic properties, although in some arrangements it may be beneficial for the third layer 60 to have viscoelastic properties to improve high velocity impact resistance of the layer stack 58.

In the layer stack 58 of FIG. 5, the thickness of the third layer 60 is dependent on the critical strain that the circuit stack 42 of the electronic display can withstand combined with the Young's modulus and thickness of the elastic first layer 50. Typically, the third layer 60 is preferably between 0.3 times and 9 times the total thickness of the circuit stack 42, and more preferably between 0.5 times and 2 times the total thickness of the circuit stack 42. Preferably, the third layer is relatively thin in comparison to the thickness of the circuit stack 42 in order to give a small indentation layer to spread the pressure before the elastic first layer 50 is deformed. By keeping the third layer 60 relatively thin in comparison to the other layers of the protective backing 44, the location of the neutral plane N of the display within the circuit stack 42 is not affected substantially by the elastic first layer 50, because the larger that the distance between the circuit stack 42 and the elastic first layer 50 is, the more the location of the neutral plane N within the circuit stack 42 is affected by the presence of the first layer 50.

In one exemplary arrangement, the third layer 60 is made of any of the foams mentioned above. Further, the third layer 60 may have a thickness of that is in the same range as, for example being approximately equal to, the thickness t1 of the (elastic) first layer 50, when added to the remaining layer stack arrangement as described relative to FIG. 4. In another exemplary arrangement, the third layer 60 is made of an elastic layer with a lower Shore durometer value, for example having a Shore OO durometer hardness value below 70, and preferably below 50.

In some arrangements, more than one diad of an elastic layer, such as the first layer 50, and a thin foam layer, such as the third layer 60, may be provided. For example, a second diad, including another layer 50 and another layer 60 coupled together by an appropriate layer 61 of adhesive, may be disposed between the foam layer 60 and the support substrate 48. Additional such diads may also be added to the protective backing 44'.

Figure 6:
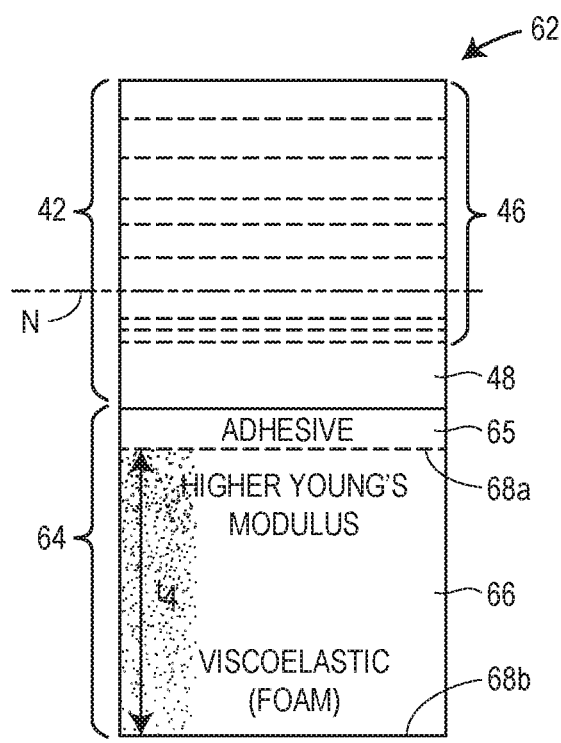
FIG. 6 is an enlarged partial cross-sectional view of a layer stack of an electronic circuit device, such as an electronic display device, exemplifying a further aspect of the present disclosure.

Turning now to FIG. 6, another layer stack 62 of an electronic circuit device, such as a flexible electronic display device, includes the circuit stack 42 forming a display stack and a protective backing 64 disposed on and coupled to a rear side of the support substrate 48 of the circuit stack 42, for example, with a thin adhesive layer 65, which may be similar to the adhesive layer 54 of the previous examples. In this example, the discrete layers of the protective backing from the examples of FIGS. 4 and 5, are replaced with a single, graded layer 66 as illustrated schematically in FIG. 6. An advantage of this arrangement is that no layers of adhesives are needed to keep separate layers of the protective backing 64 together, which may thereby reduce the thickness, number of manufacturing steps, and possibly the cost of producing the graded layer 66, as opposed to the multilayer protective backing 44 and 44'. When the graded layer 66 is used, the same general guidelines can be used as for the combination of the elastic first layer 50 and the viscoelastic foam second layer 52. For example, the upper portion of the graded layer 66 (i.e., the portion nearest the layer stack 42) typically has a Shore durometer value generally similar to or about the same as the Shore durometer value of the elastic first layer 50, and the lower part (i.e., the portion furthest away from the layer stack 42) typically has the properties of the viscoelastic foam second layer 52. In addition, the total thickness t4 is preferably similar to, such as approximately equal to, the thickness t2 of the foam second layer 52.

The graded layer 66 has a material and structure composition, and thereby, elastic and viscoelastic properties, that vary along or through the thickness t4 of the graded layer from the front side 68a of the graded layer 66 (the top side as seen in FIG. 6) to the back side 68b of the layer 66 (the bottom side as seen in FIG. 6). Preferably, the material and structural composition of the graded layer 66 varies relatively smoothly along the thickness of the layer 66. That is, the material and structural composition of the graded layer 66 preferably does not have well-defined transition points or regions between the different regions of the layer.

Preferably, the front side 68a of the graded layer 66 has a higher elasticity (i.e., is more elastic) than the back side 68b. Thus, the front side 68a forms an elastic region of the graded layer 66. In addition, the back side 68b has a higher viscoelasticity (i.e., is more viscoelastic) than the front side 68a. Thus, the back side 68b forms a viscoelastic region of the graded layer 66. The elasticity and the viscoelasticity of the material of the graded layer 66 varies gradually through the thickness t4 from one side to the other. In this arrangement, the elastic region of the front side 68a serves to protect the electrical circuit layers 46 from low velocity impacts, and the viscoelastic region of the rear side 68b protects the electrical circuit layers 46 from high velocity impacts. Further, the viscoelastic region the rear side 68b does not add substantial stiffness to the overall circuit stack 42 when flexed relatively slowly under normal use. Thus, in this arrangement, the more elastic side of the graded layer 66

(the front side 68*a*) is disposed nearer to the circuit stack 42 than the viscoelastic side (the rear side 68*b*), similar to the example of FIG. 4.

Preferably, the foam material of the graded layer 66 is any one or more of the foams described previously herein; however, other foam materials capable of providing the advantages described herein may also be used. In one case, the graded layer 66 may be formed of a foam material having cells surrounded by cell walls, as is typical for all foams. The openness of the cells, size of the cells, and size of the cell walls vary gradually through the thickness of the graded layer 66 from the front side 68*a* to the rear side 68*b*. More open cells are less viscoelastic, whereas less open cells are more viscoelastic. Further, smaller cells with thicker cell walls typically result in a foam having a higher Young's modulus (under low strain rates) than with larger cells and thinner cell walls.

In one exemplary arrangement, the openness of the cells preferably varies gradually from the front side 68*a* of the graded layer 66 to the rear side 68*b* of the graded layer 66. In addition, the average cell size of the cells preferably varies gradually from the front side 68*a* to the rear side 68*b*. Furthermore, the average thickness of the cell walls preferably vary gradually from the front side 68*a* to the rear side 68*b*. Still further, the cells may vary in a linear or in a non-linear manner through the graded foam layer 66, and/or the graded foam layer 66 may have regions of cells of similar properties layered adjacent to one another. The various layered regions may be of the same or of different thicknesses as measured along the thickness t4 from the front side 68*a* to the rear side 68*b*.

In additional exemplary arrangements, additional elastic and/or viscoelastic layers may be added to any one of the protective backings 44, 44', and 64 in order to obtain a specific profile needed for a specific set of constraints for a given electronic circuit device exhibiting a given critical pressure and strain during use.

An electronic circuit device, such as a flexible electronic display, including a protective backing according to the teachings of the present disclosure is believed to benefit from the advantage of being protected from both low velocity impacts and high velocity impacts, preferably while simultaneously maintaining the neutral axis or plane of the total layer stack within or very close to the most strain sensitive layers of the circuit stack.

Figure 7:
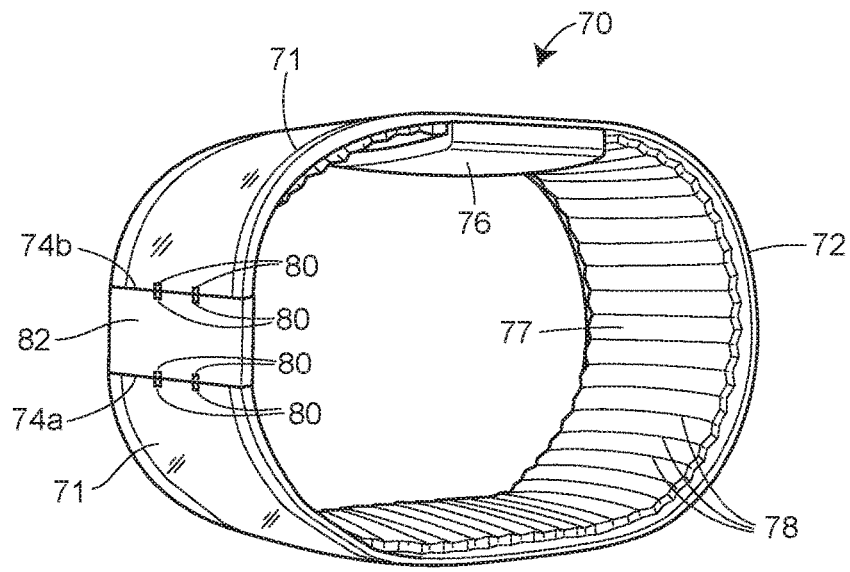
FIG. 7 illustrates a dynamically flexible electronic display device according to some aspects of the disclosure in the form of a wrist band device.
Figure 8:
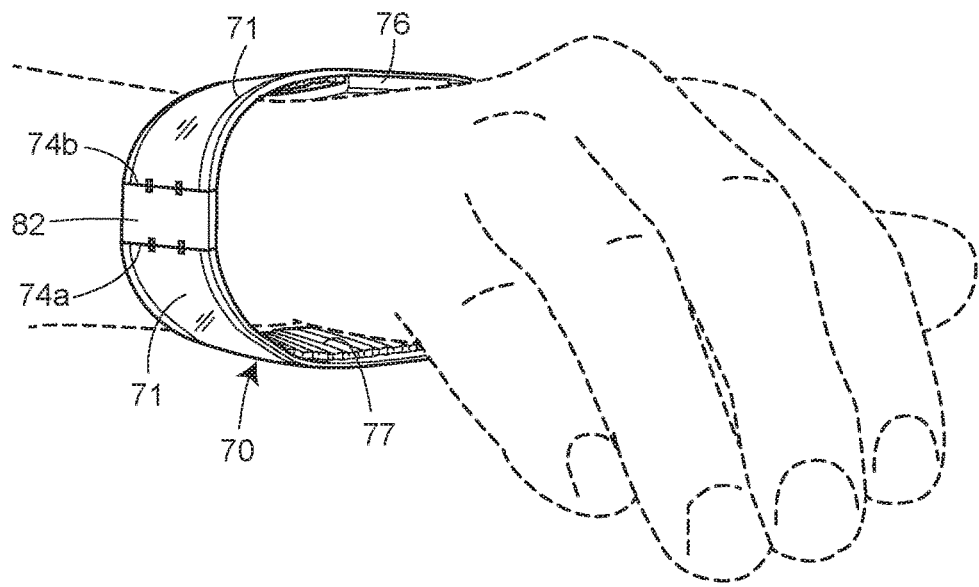
FIG. 8 illustrates the band of FIG. 7 when connected around a user's wrist.
Figure 9:
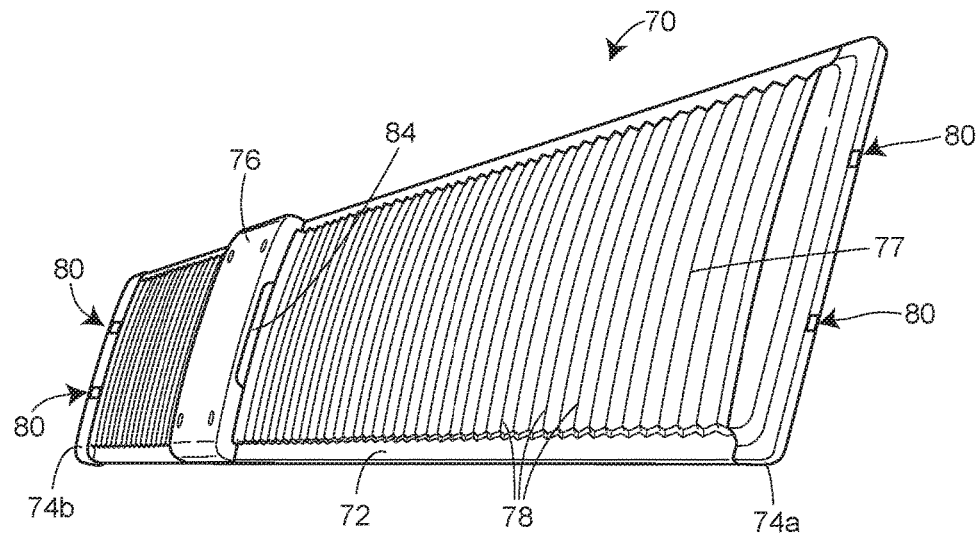
FIG. 9 is a rear perspective view of the band of FIG. 7 laid out in a flat configuration.

Turning now to FIGS. 7-10, any one of the electronic displays layer stacks 40, 58, or 62 may be implemented as part of an electronic display in many different and various types of displays. In particular, where the support substrate 48 is a flexible substrate, the electronic displays may be dynamically flexible, attachable, and/or incorporated into wearable articles or devices. FIGS. 7, 8, and 9 illustrate an embodiment of a dynamically flexible, attachable and/or wearable device 70, which in this example is in the form of a wrist band device, which incorporates a dynamically flexible electronic display 71 with a layer stack 40, 58, or 62 as described previously herein, in which the support substrate 48 is formed of a dynamically flexible material, and adapted to be worn on the wrist of a person. The device 70 may, for example, provide telephone, computer, and/or time showing functionalities, and/or other functionalities that would benefit from having an electronic display for displaying changeable information to a user. In some arrangements, the electronic display 71 may be a touch screen that allows input of commands and/or information by touching various areas of the visual display area of the electronic display.

The wrist band device 70 includes a flexible band portion 72, which is generally rectangular in shape and configuration when laid flat, disposed between two ends, end pieces, or fasteners 74*a* and 74*b*. The flexible band portion 72 can be selectively bent into an oval or circular shape, for example, to encompass a user's wrist. The band portion 72 can be configured to be stiff enough such that the band 72 can retain its shape when bent (i.e., the band 72 is not floppy). The band portion 72 includes a protective backing 44, 44', or 64 disposed on the back side of the electronic display 71 intended to face the user's wrist when worn such that the electronic display 71 is viewable from the top (i.e., the outside of the band 72 when curved as shown in the figures) of the band 72. Preferably, the protective backing 44, 44', or 64 covers the entire area of the back side of the electronic display 71 in order to provide maximum impact protection. In this arrangement, the protective backing 44, 44' or 64 is covered by an optional comfort layer 77 provided for comfort to the wearer. The comfort layer 77 is preferably made of a soft foam. Therefore, the protective backing 44, 44' or 64 is not visible in FIGS. 7-9, but rather is hidden by the comfort layer 77. A mechanical layer (not visible), which may be made of metal and/or plastic, may further optionally be disposed between the protective backing 44, 44', or 64 and the comfort layer 77.

An electronics module 76 having an exterior casing or cover is disposed on the band 72 at a position between the two end pieces 74*a* and 74*b*. The electronics module 76 controls the functioning of the electronic display 71. Preferably, the electronics module 76 is not centered between the two end pieces 74*a* and 74*b*, but rather is disposed closer to one end piece 74*b* than the other end piece 74*a*. The electronic display 71 extends between and preferably to each of the two end pieces 74*a* and 74*b*. The electronics module 76 (or the cover associated with that module) may act as a reference mark or reference location that is to be placed at a particular position on a user's wrist, in this case, on the top of a user's wrist. The electronics module 76 or the cover associated with the module is optionally contoured or curved to better match the contour of a wearer's wrist but could alternatively be flat.

As best illustrated in FIGS. 7 and 9, a plurality of grooves 78 may be formed (e.g., molded) in an underside (i.e., the rear side) of the comfort layer 77. The grooves 78 extend in the width direction across the band 72 from one side of the band 72 to the opposite side of the band 72 (i.e., oriented transversely). Each groove 78 extends through only a portion of the thickness of the foam layer such that the comfort layer 77 includes a continuous layer of foam material immediately adjacent an underside of the flexible electronic display 71 and/or the protective backing 44, 44', or 64 and a plurality of sections or islands that jut or extend upward from the bottom layer between adjacent respective grooves 78. The grooves 78 may, when the band 72 is being bent, control the amount of bending between the sections of the comfort layer 77, and, in turn, control the amount of bending applied to the flexible electronic display 71. The size, number, spacing and/or compressibility of the foam material and the grooves 78 may be varied to define, and thus limit, the amount of torsional or other bending motion that can be applied to the comfort layer 77.

One or both of the end pieces or clasps 74*a*, 74*b* may include a connection structure therein that functions to connect the end pieces 74*a*, 74*b* together when the band portion 72 is bent, as illustrated in FIGS. 7 and 8, to form a circular or oval band. The two end pieces 74*a* and 74*b* are arranged to provide an end-to-end connection, wherein the end of the end piece 74a couples to the end of the end piece 74b without an overlap. The connection structure may be in the form of magnetic materials 80 disposed in or on each of end pieces 74a, 74b, wherein the magnet materials 80 operate, when in close proximity to one another, to hold the end pieces 74a, 74b together. The magnetic materials 80 can each be a permanent magnet, or one of the materials 80 can be a permanent magnet while the other material 80 can be a magnetically permeable material, such as many kinds of metal. The magnetic materials 80 can be disposed at the longitudinal ends of the end pieces 74a, 74b so that the end pieces 74a, 74b connect end-to-end when the band 72 is bent. In some arrangements, the end pieces 74a and 74b may include complementary sets of magnetic connectors 80 used in conjunction with a mechanical connector, to effect a clasping structure in a fixed length band 72. Preferably, the end pieces 74a and 74b can be mechanically and magnetically connected to one another in an end-to-end connection when the wrist band device 70 is bent, as illustrated in FIGS. 7 and 8, to form a circular or oval wrist band. Various combinations and arrangements of magnetic connectors 80 and/or mechanical connectors may be used to enable easy coupling and decoupling of the opposite ends of the band 72 in an operable manner to the user's wrist.

Optionally, one or more extenders 82 can be removably coupled to one or both of the first and second end pieces 74a, 74b of the band 72 to adjust the length of the band 72 and/or to add or increase functionality to the device 70. Preferably, the extender(s) 82 have complementary clasping mechanisms to the clasping mechanisms 80 in each of the end pieces 74a, 74b such that one or more extenders 80 can be removably coupled to one or both of the end pieces 74a, 74b and/or to one another. Thus, for example, the extender 82 may have magnets 80 on opposite ends and/or a tab on one end and a recess on the other end complementary to the clasping mechanisms of the end pieces 74a, 74b. It will be understood that any number of extenders 82 can be used, depending on the desired length of the band 72 and/or the desired functionality.

As illustrated by a user's wrist in dotted relief in FIG. 8, the position of the extender 82 corresponds (e.g., is adjacent) to the outer side of the user's wrist. As such, the flexible electronic display 71 forms a continuous electronic display that extends the entire top of the wrist, through the inner side of the wrist, to the bottom of the wrist. This continuous usable display enables a user to view a long continuous screen or multiple serial display screens disposed next to one another on the flexible electronic display 71 without there being any discontinuity in the display of these screens, as the user turns his or her wrist between a palm up and a palm down position or vice versa.

FIG. 9 illustrates the back of the wrist band device 70 of FIGS. 7 and 8, when the band 72 is laid out flat or straight. The electronics module 76 sticks away from the rear surface of the band 72 and thus provides a tactile sensation to the user when the user wears the wrist band device 70. This feature, in turn, makes using the module 76 as the reference point for the user when placing the band on the user's wrist more natural, as the user can feel the presence of the module 76 in the correct location on the top (or bottom) of his or her wrist, and thus will know that the band 72 is properly aligned on the wrist to provide for a maximal continuous usable display surface in the manner described above. Still further, as illustrated in FIG. 9, the electronics module 76 may have one or more contact points 84 that for charging a battery (not shown) disposed within the electronics module 76 and/or to provide electronic communications between the electronics module 76 and another device, such as a base station or a base unit.

Figure 10:
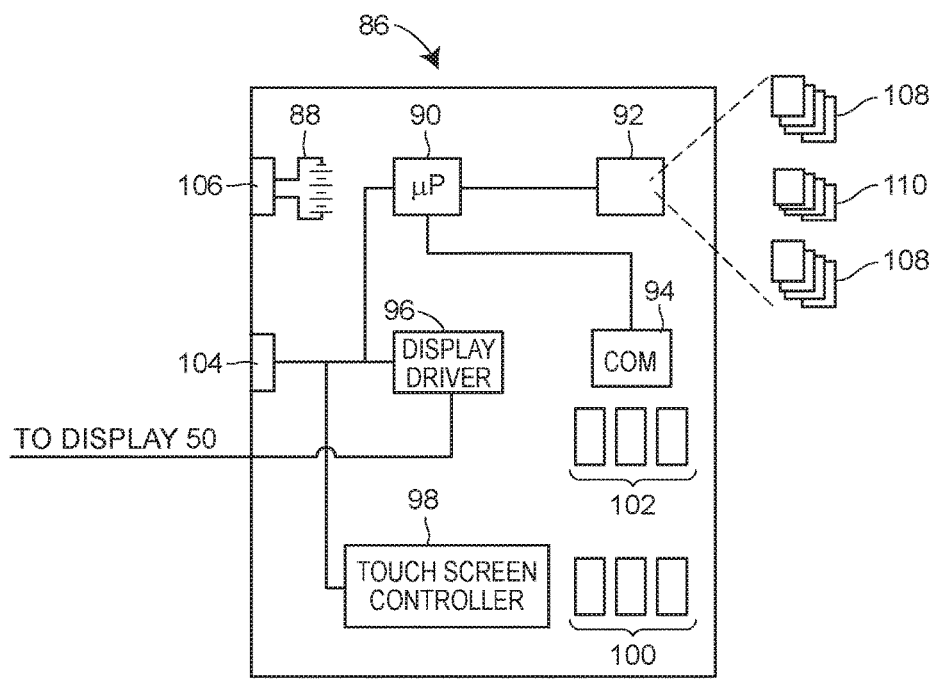
FIG. 10 is a block diagram of an electronics control module associated with the devices described herein.

FIG. 10 illustrates a block diagram of various electronic components, referred to herein as an electronics suite 86, that may be used in or disposed in the electronics module 76 to drive the flexible electronic display 71. The electronics suite 86 includes a battery 88 that powers a number of other modules or electronic components, including a microprocessor or other processor 90, a computer readable memory 92, which may be, for example, a flash memory or other suitable type of non-transitory, tangible, data storage medium, a communication module 94, a display driver 96, a touch screen controller 98, and a number of sensors 100 and other secondary devices 102.

The sensors 100 may include, for example, any number of types of sensors, such as strain gauges, gyroscopes, accelerometers, compression sensors, tensional strain sensors, positional sensors, motion or movement sensors, pressure sensors, vibration sensors, temperature sensors, orientation sensors, gravity sensors, light sensors, and piezoelectric sensors, to name a few. The secondary electronic devices 102 may include, for example, an alarm or noise creation device, a speaker, a microphone, a vibrator the operation of which causes the clasp 54a, 54b or electronics module 40 to vibrate, etc. The sensors 100 and the secondary electronic devices 102 may be integral with the electronics suite 86 and/or one or more of the sensors 100 and/or the secondary electronic devices 102 may be physically disposed at one or more other locations along the band 72 separate from the remainder of the electronics suite 86. In any case, the sensors 100 and the secondary electronic devices 102 remain in communicative connection with the remainder of the electronics suite 86, for example, via a wired or wireless connection. The sensors 100 may include touch sensors that allow the electronic display 71 to have touch screen functional capabilities.

The memory 92, the communication module 94, the display driver 96, and the touch screen controller 98, as well as the sensors 100 and other secondary electronic devices 102, are communicatively connected to the processor 90 and may operate to perform various functions in conjunction with applications or other programs implemented by the processor 90, in any manner understood in the art. Still further, each of these elements is connected to and is powered by the battery 88 in any known or desired manner. In addition, the electronics suite 86 may include one or more communication ports, such as communication port 104 (e.g., a USB or other type of digital communication port) and/or a power or battery charger input port 106. The power input port 106 is connected to the battery 88 and enables charging or recharging of the battery 88 using any known or desired recharging circuitry and methodology. Alternatively or in addition, the communications input port 104 (in the form of for example, a USB input port) may be connected to the battery 88 and provide power for charging the battery 88, and the input port 104 may also be connected to the microprocessor 90, as well as to the communication circuit module 94, for performing wired-based communications via the input port 104. Additionally or alternatively, the input port 104 may include a wireless input port for performing wireless communications. The power input port 106 may be a wireless input port for powering the device 70, for example, a battery charger unit that operates to charge the battery 88 using an inductively coupled charging technique.

The processor 90, which may be a programmable, general-purpose processor or a specially programmed processor programmed using any desired type of hardware or firmware programming, generally coordinates and implements the operation of the flexible electronics display 71 and the associated electronic components as described in more detail herein. The computer readable memory 92 stores various applications, including for example the general operating system implemented by the processor 90, and various applications 108 to be run on the processor 90 to implement various different types of functionality via the device 70. The memory 92 may also store one or more data files 110, which may be, for example, image or video data files associated with various images to be displayed on the display screen 71 at various different times. The microprocessor 90 or one of the secondary electronic components 102 may include or be a clock that tracks the current time, day, date, month, year, time zone, etc.

The communication module 94 may include or use any type of communication hardware/software/firmware that uses any desired types of communication techniques to enable the microprocessor 90 to communicate with exterior devices or sources. For example, the communication module 94 may be a wired or wireless Internet-based communication module that may provide wired or wireless-based, IP protocol communications between the device 70, and other devices or a communication network such as a LAN or a WAN to which other devices are communicatively connected. Likewise, the communication module 94 may include a near field communications (NFC) module, a radio frequency identification (RFID) communications module for communicating with RFID tags stored in other devices around or close to the device 70, a Bluetooth communication module, and so on. Still further, the communications module 94 may include a USB or other type of wired communication module for decoding and encoding USB-based communication signals to be sent out and received via the USB communication port 104.

The display driver 96 is coupled to the microprocessor 90 and to the flexible electronic display 71, and drives the flexible electronic display 71 to present different images to a user and thus implement functionality via the flexible electronic display 71. The display driver 96 may be associated with or use any type of display driver technology associated with the various different types of flexible displays that might be used, including, for example, e-ink or other bi-stable display drivers, organic light emitting diode (OLED) display drivers, electrophoretic, e-paper, etc. The display driver 96 is connected to the various pixel elements or pixels of the flexible display 71 by means of the primary electrodes, for example, via the row electrodes and the column electrodes, to cause the pixel elements to change their visual appearance so as to present content image on the flexible display 71 in any manner well understood in the art, the details of which are not repeated here for brevity.

In an optional arrangement, the touch screen controller 98 is connected to a touch screen interface (e.g., the touch screen 25) if such an interface exists, and receives input signals from the touch screen interface. The controller 98 operates to decode these input signals to identify touch events that occur with respect to the touch screen interface in any manner understood in the art. Any types of touch screen interfaces suitable for use with the flexible electronic display 71 may be used.

The sensors 100 may include one or more gyroscopes which detect movement of or the orientation of the band 72. The output of such gyroscopes can be used by the microprocessor 90 to determine the orientation or direction of the flexible electronic display 71 to enable the microprocessor 90, or an application 108 executed on the microprocessor 90, to determine the proper orientation of the image to be displayed on the flexible electronic display 71. In some instances, devices might be located so as to be able to determine whether the device 70 is oriented around a wrist or other circular member or whether it is instead laid out flat or oriented in some other manner. The microprocessor 90 or an application 108 executed thereon may change functionality, behavior, and/or actions of the device 70 based on the detected orientation of the band 72.

In some cases, the sensors 100 include one or more pressure or force sensors and/or strain gauges which detect pressure, strain, or similar forces that are considered to be an input to cause the functionality, behavior, and/or actions of the device 70 to change, e.g., reset the device 70, change a mode of the device 70, change a presentation displayed on the flexible electronic display 71, etc. In one example, two pressure or force sensors are positioned on or attached to the band 72 (e.g., as part of the backplane of the flexible display 71 or as part of the comfort layer 77 so that when the device 70 is attached to itself in a generally circular or looped configuration, the pressure or force sensors are diametrically opposed to each other.

The example device 70 of FIGS. 7-10 is only exemplary arrangement, it being understood that the electronic display 71 with a protective backing 44, 44' or 64 may be used in an almost infinite number of different forms and/or applications. Thus, the disclosure is not limited to implementing the electronic display 71 in the device 70, but rather may be implemented in any functionally compatible device as desired.

Although the examples described in detail are directed generally to electronic displays, the features and arrangements may be used for other flexible electronics more generally, such as, flexible circuits, flexible displays, flexible solar cells, flexible OLET lighting, and so on. The teachings of the present application may be applied to active-matrix displays, passive-matrix displays, and segmented displays and lights. Thus, the exemplary arrangement shown in the drawings and described in detail herein are not intended to be limiting of the invention, but rather a provided as just one example out of many possible arrangements to enable the person of ordinary skill to make and use the invention. Additional arrangements, combinations of features, and/or advantages of the invention are contemplated within the scope of the claims appended hereto.

What is claimed:

1. An electronic circuit device, comprising:
  a circuit stack including at least one layer of electrical circuits carried by a support substrate and disposed on a front side of the support substrate; and
  a protective backing carried by the support substrate and disposed on a back side of the support substrate, wherein the protective backing further comprises:
    a first layer formed of a first elastic material; and
    a second layer formed of an elastomeric material, wherein the first material has a higher elasticity than the second material,
    wherein the second material has a higher viscoelasticity than the first material, and
    wherein the first layer protects the electrical circuits from low velocity impacts, the second viscoelastic layer protects the electrical circuits from high velocity impacts, and the second layer does not add substantial stiffness to the overall circuit stack when flexed relatively slowly under normal use.

2. The electronic circuit device of claim 1, wherein the first layer has a Shore A durometer hardness value between about 35 and about 80.

3. The electronic circuit device of claim 1, wherein the first layer has a Young's modulus between about $10^{-3}$ GPa and about $2\times10^{-1}$ GPa.

4. The electronic circuit device of claim 1, wherein the first layer comprises neoprene rubber, santoprene rubber, silicone rubber, and/or ethylene-vinyl acetate.

5. The electronic circuit device of claim 1, wherein the second layer has a ratio of viscosity to thickness between about 0.25 GPa s/m and about 5 GPa s/m.

6. The electronic circuit device of claim 1, wherein the second layer has a viscoelasticity between about 250 Pa s and about 5 MPa s.

7. The electronic circuit device of claim 1, wherein the second layer comprises flexible polymer foam, polyurethane foam, gel memory foam, and/or vinyl foam.

8. The electronic circuit device of claim 1, wherein the first layer is disposed nearer to the circuit stack than the second layer.

9. The electronic circuit device of claim 8, wherein a front side of the first layer is coupled to the back side of the support substrate.

10. The electronic circuit device of claim 9, wherein a front side of the second layer is coupled to a back side of the first layer.

11. The electronic circuit device of claim 1, wherein the first layer is between two times and ten times thinner than the second layer.

12. The electronic circuit device of claim 1, the protective backing further comprising a third layer made of viscoelastic foam or an elastic material.

13. The electronic circuit device of claim 12, wherein the third layer is disposed between the first layer and the support substrate.

14. The electronic circuit device of claim 13, wherein the protective backing further comprising another diad, comprising a thin foam layer and an elastic layer.

15. The electronic circuit device of claim 13, wherein the third layer is thinner than each of the first layer and the second layer.

16. The electronic circuit device of claim 12, wherein the third layer is made of viscoelastic foam that has a viscoelasticity between about 250 Pa s and about 5 MPa s.

17. The electronic circuit device of claim 1, wherein the circuit stack comprises a display stack, and the electronic circuit device comprises an electronic display.

18. An electronic circuit device, comprising:
a circuit stack including at least one layer of electrical circuits carried by a support substrate and disposed on a front side of the support substrate; and
a protective backing carried by the support substrate and disposed on a back side of the support substrate, wherein the protective backing further comprises:
a single graded layer with a graded structure that varies gradually through the thickness of the graded layer from a first side to a second side, wherein the first side has a higher elasticity than the second side, the second side has higher viscoelasticity than the first side, and the elasticity and the viscoelasticity of the material vary gradually through the thickness of the graded layer from the first side to the second side,
wherein the first side protects the electrical circuits from low velocity impacts, the second side protects the electrical circuits from high velocity impacts, and the second side does not add substantial stiffness to the overall circuit stack when flexed relatively slowly under normal use.

19. The electronic circuit device of claim 18, wherein the first side of the graded layer is disposed nearer to the circuit stack than the second side.

20. The electronic circuit device of claim 18, wherein the graded layer is formed of a foam material having cells surrounded by cell walls, wherein the openness of the cells, size of the cells, and size of the cell walls vary gradually through the thickness of the layer from the first side to the second side.

* * * * *